United States Patent
Olive et al.

(10) Patent No.: US 10,175,937 B1
(45) Date of Patent: Jan. 8, 2019

(54) CUSTOMIZED HEADPHONE SOUND QUALITY

(71) Applicant: HARMAN INTERNATIONAL INDUSTRIES, INCORPORATED, Stamford, CT (US)

(72) Inventors: Sean E. Olive, Oak Park, CA (US); Todd W. Welti, Thousand Oaks, CA (US); Omid Khonsaripour, Northridge, CA (US)

(73) Assignee: Harman International Industries, Incorporated, Stamford, CT (US)

(*) Notice: Subject to any disclaimer, the term of this patent is extended or adjusted under 35 U.S.C. 154(b) by 0 days.

(21) Appl. No.: 15/834,137

(22) Filed: Dec. 7, 2017

(51) Int. Cl.
*G06F 3/16* (2006.01)
*H04R 1/10* (2006.01)
*H03G 5/16* (2006.01)
*G06F 3/0482* (2013.01)
*G06Q 30/02* (2012.01)
*G06Q 30/06* (2012.01)
*G06F 3/0484* (2013.01)

(52) U.S. Cl.
CPC .......... *G06F 3/165* (2013.01); *G06F 3/0482* (2013.01); *H03G 5/165* (2013.01); *H04R 1/1041* (2013.01); *G06F 3/04847* (2013.01); *G06Q 30/0201* (2013.01); *G06Q 30/0204* (2013.01); *G06Q 30/0621* (2013.01); *G06Q 30/0631* (2013.01)

(58) Field of Classification Search
CPC ..... H04R 1/1041; G06F 3/165; G06F 3/0482; G06F 3/04847; H03G 5/165; G06Q 30/0201; G06Q 30/0204; G06Q 30/0621; G06Q 30/0631

USPC .......................................................... 381/74
See application file for complete search history.

(56) References Cited

PUBLICATIONS

Olive, Sean E. et al., "A Virtual Headphone Listening Test Methodology," Audio Engineering Society 51st International Conference, Helsinki, Finland, Aug. 22-24, 2013.*
Olive, Sean E. et al., "A Virtual Headphone Listening Test Methodology," Audio Engineering Societ6y 51st International Conference, Helsinki, Finland, Aug. 22-24, 2013 (10 pages).
Welti, Todd et al., "Validation of a Virtual In-ear Headphone Listening Test Method," Audio Engineering Society 141st Convention, Los Angeles, California, USA, Sep. 29-Oct. 2, 2016 (13 pages).

* cited by examiner

*Primary Examiner* — Paul S Kim
(74) *Attorney, Agent, or Firm* — Brooks Kushman P.C.

(57) ABSTRACT

A headphone testing system includes a memory storing a headphone test application, headphone characteristics of a headphone connected to the headphone tester system, and headphone characteristics of a plurality of headphone models to test. A processor is programmed to execute the headphone test application to simulate a first of the plurality of headphone models using the headphone characteristics of the connected headphone and the headphone characteristics of the first of the plurality of headphone models, simulate a second of the plurality of headphone models using the headphone characteristics of the connected headphone and the headphone characteristics of the second of the plurality of headphone models, receive user input regarding user preference for the first of the plurality of headphone models and the second of the plurality of headphone models, and present results indicating which of the headphone models is scored highest according to the user input.

16 Claims, 8 Drawing Sheets

CUSTOMIZED HEADPHONE SOUND QUALITY

TECHNICAL FIELD

Aspects of the disclosure generally relate to customization of headphone sound quality.

BACKGROUND

Blind testing is used when items are to be compared without influences from preferences or expectations of the test subjects. Blind testing may be useful in comparative testing of commercial products to objectively assess user biases, in an attempt to avoid influence from branding and other properties that should not be tested. For audio products in particular, sighted and blind listening tests tend to produce significantly different sound quality ratings.

SUMMARY

In one or more illustrative embodiments, a headphone testing system includes a memory storing a headphone test application, headphone characteristics of a headphone connected to the headphone tester system, and headphone characteristics of a plurality of headphone models to test. A processor is programmed to execute the headphone test application to simulate a first of the plurality of headphone models using the headphone characteristics of the connected headphone and the headphone characteristics of the first of the plurality of headphone models, simulate a second of the plurality of headphone models using the headphone characteristics of the connected headphone and the headphone characteristics of the second of the plurality of headphone models, receive user input regarding user preference for the first of the plurality of headphone models and the second of the plurality of headphone models, and present results indicating which of the headphone models is scored highest according to the user input.

In one or more illustrative embodiments, a method for testing headphones includes receiving a selection of a plurality of headphone models to be tested; simulating, using a replicator headphone, each of the plurality of headphone models in a randomized order to perform a blind listening test; receiving one or more user inputs regarding user preference for the headphone models; and presenting test results indicating a preference score for each of the plurality of headphone models to be tested, each preference score accompanied by an option to purchase respective headphone model of the plurality of headphone models.

In one or more illustrative embodiments, non-transitory computer-readable medium comprising instructions of a headphone test application that, when executed by a processor of a computing device, cause the device to receive a selection of a plurality of headphone models to be tested through a replicator headphone receiving audio from the computing device; simulate each of the plurality of headphone models in a randomized order to perform a blind listening test, including, for each of the respective headphone models to be tested, to generate a difference in frequency response from the replicator headphone to the respective headphones model to be tested and to simulate the respective headphones model by playing an audio program through the replicator headphones equalized according to the difference in frequency response; receive user input regarding user preference for the headphone models responsive to the playing of the audio program through the headphones; and present test results indicating a preference score for each of the plurality of headphone models, each preference score accompanied by an option to purchase the respective headphone model.

DETAILED DESCRIPTION

Figure 1:
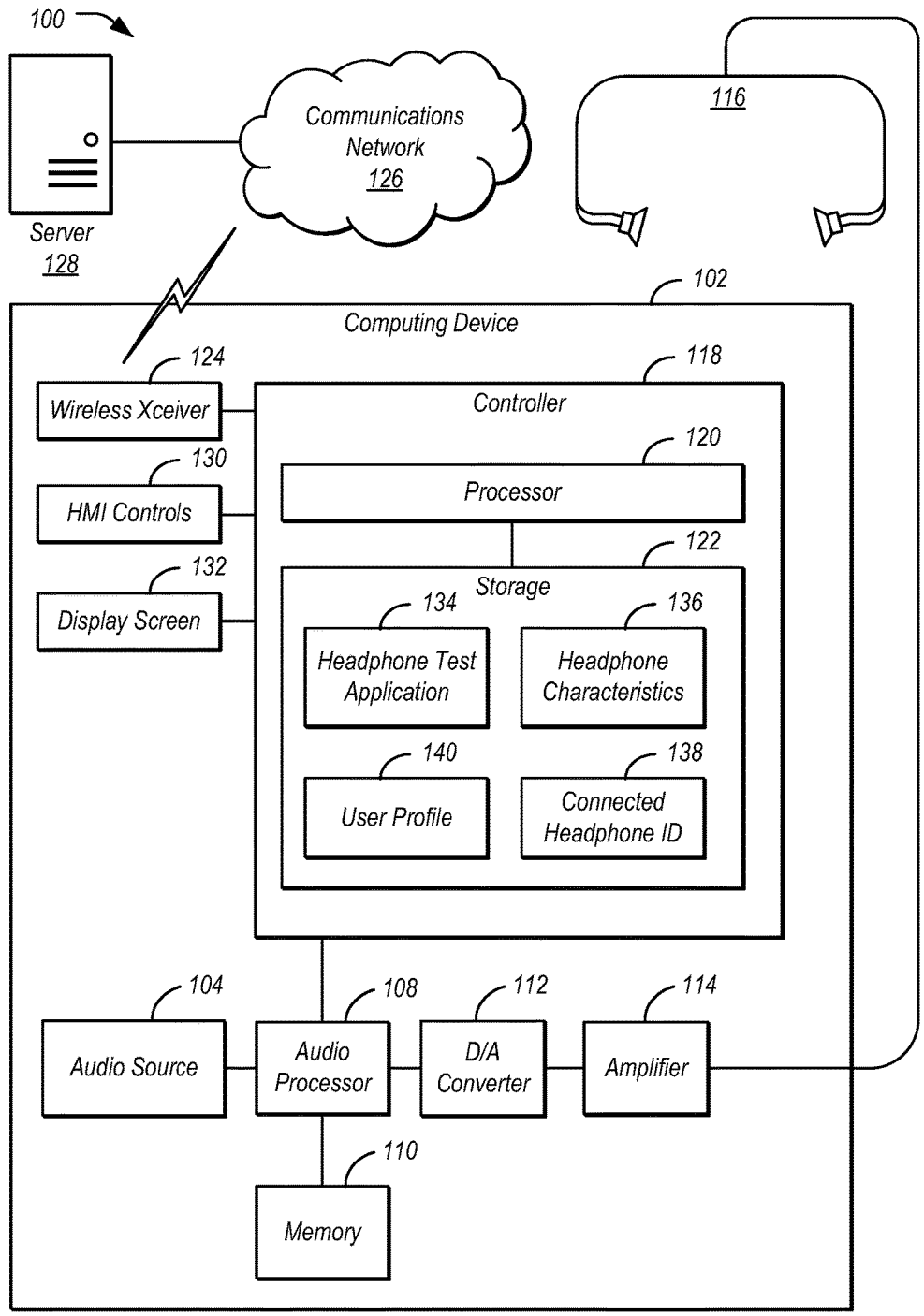
FIG. 1 illustrates an example system for performing virtual headphone listening tests.

As required, detailed embodiments of the present invention are disclosed herein; however, it is to be understood that the disclosed embodiments are merely exemplary of the invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

Audio products may be sold online through various websites or supply channels. While convenient, such sales fail to provide an opportunity for the consumer to audition and compare multiple products. Although the consumer may consider product reviews, it may not be possible for the consumer to decide which specific product sounds the best or best conforms to the personal tastes of the consumer. Moreover, consumers may have little opportunity to customize the sound of their headphones to suit their personal tastes.

A headphone testing application may be provided to allow for the consumer to compare the sound characteristics of different headphones through the consumer's existing headphone. The application may also allow for the consumer to choose (and even purchase) the model that the consumer most prefers. Thus, the headphone application may be used by Internet retailers of headphones, as well as by brick-and-mortar retailers.

Additionally or alternatively, the application may allow the consumer to customize the sound characteristics of his or her existing headphone according to a personal preferred sound profile. The sound profile may be generated by the application by performing a series of tests that provide customized compensation settings that are either stored in a headphone application or stored in memory in their headphone. In an example, these customized compensation settings may be applied to the headphone via programmable filters of the headphone. In one example, the headphone filters may be programmed over-the-air. In another example, the filters may be programmed via a wired connection, such as via a universal serial bus (USB) connection.

In an example, the headphone testing application may be implemented as a web application using standard web programming tools, such as hypertext markup language 5 (HTML5), JavaScript, and Audio Web Tools, such that the application could be administered on a laptop, tablet, or mobile phone.

The headphone application may collect data regarding the consumers' sound quality preferences, and may provide the data to a server for analysis. The server may utilize the data to provide new knowledge and insight into listeners' headphone sound quality preferences, music preferences, and how they may be influenced by important demographic factors (age, gender, culture, hearing loss). Accordingly, this data may be used to gain a better understanding of what consumers want and how to better design headphones that meet consumer needs. In an example, headphone manufacturers and researchers who want to conduct research and development on listener headphone sound quality preferences may utilize the headphone application as a source of data for the design of future headphone models. Moreover, analytics provided to users may be useful to the headphone enthusiast. Further aspects of the disclosure are discussed in detail below.

FIG. 1 illustrates an example system 100 for a computing device 102 implementing a headphone testing application 134 to perform virtual headphone listening tests. The computing device 102 selects audio via an audio source 104 or an audio input, and passes the audio to be processed to an audio processor 108. Audio output from the audio processor 108 may be passed through a digital to analog (D/A) converter 112 and an amplifier 114 for reproduction by a headphone 116. The computing device 102 also includes a controller 118 connected to the audio processor 108 and configured to manage the performance of the virtual headphone listening tests via the headphone testing application 134. The controller 118 determines an audio source to play back and a headphone to simulate, and directs the audio processor 108 to process the audio to conform to that of the simulated headphone. The controller 118 also interfaces with a wireless transceiver 124 to facilitate communication over a communications network 126, to provide the results to a remote server 128. In many examples, the controller 118 is also connected to one or more human machine interface (HMI) controls 130 to receive user input, as well as a display screen 132 to provide visual output. It should be noted that the illustrated system 100 is merely an example, and more, fewer, and/or differently located elements may be used.

The audio source 104 may be a recording such as a music program that may be used in the headphone tests. In an example, the audio source 104 may include one or more stereo tracks that were digitally copied from a compact disc and edited into brief 10-20 second loops. These loops or other generated sounds may be referred to as recordings herein, and may be used to supply audio output for use in testing. In some examples, the audio source 104 may be analog instead of digital, and in such cases the system may further include an analog to digital (A/D) converter 106 that converts signals from an analog format into a digital format for further processing by the audio processor 108.

While only one is shown, one or more audio processors 108 may be included in the computing device 102. The audio processors 108 may be one or more computing devices capable of processing audio and/or video signals, such as a computer processor, microprocessor, a digital signal processor, or any other device, series of devices, or other mechanisms capable of performing logical operations. The audio processors 108 may operate in association with a memory 110 to execute instructions stored in the memory 110. The instructions may be in the form of software, firmware, computer code, or some combination thereof, and when executed by the audio processors 108 may provide for headphone virtualization functionality as well as for recommendation of products that may be preferred by the user. The memory 110 may be any form of one or more data storage devices, such as volatile memory, non-volatile memory, electronic memory, magnetic memory, optical memory, or any other form of data storage device. In addition to instructions, operational parameters and data may also be stored in the memory 110, such as a phonemic vocabulary for the creation of speed from textual data.

The D/A converter 112 receives the digital output signal from the audio processor 108 and converts it from a digital format to an output signal in an analog format. The output signal may then be made available for use by the amplifier 114 or other analog components for further processing.

The amplifier 114 may be any circuit or standalone device that receives audio input signals of relatively small magnitude, and outputs similar audio signals of relatively larger magnitude. Audio input signals may be received by the amplifier 114 and output on one or more connections to the headphones 116. The amplifier 114 may include capability to adjust volume, balance, and/or fade of the audio signals provided to the headphones 116. In still other examples, the headphones 116 may include the amplifier 114, such that the headphones 116 are self-powered. The headphones 116 may be in-ear or over-the-ear headphones suitable for use by one or more users.

The controller 118 may include various types of computing apparatus in support of performance of the functions of the computing device 102 described herein. In an example, the controller 118 may include one or more processors 120 configured to execute computer instructions, and a storage medium 122 on which the computer-executable instructions and/or data may be maintained. A computer-readable storage medium (also referred to as a processor-readable medium or storage 122) includes any non-transitory (e.g., tangible) medium that participates in providing data (e.g., instructions) that may be read by a computer (e.g., by the processor (s) 120). In general, a processor 120 receives instructions and/or data, e.g., from the storage 122, etc., to a memory and executes the instructions using the data, thereby performing one or more processes, including one or more of the processes described herein. Computer-executable instructions may be compiled or interpreted from computer programs created using a variety of programming languages and/or technologies including, without limitation, and either alone or in combination, Java, C, C++, C#, Assembly, Fortran, Pascal, Visual Basic, Python, Java Script, Perl, PL/SQL, etc.

As shown, the controller 118 may include a wireless transceiver 124 or other network hardware configured to facilitate communication between the controller 118 and other networked devices over the communications network 126 such as the server 128. As one possibility, the wireless transceiver 124 may be a cellular network transceiver configured to communicate data over a cellular telephone network. As another possibility, the wireless transceiver 124 may be a Wi-Fi transceiver configured to connect to a local-area wireless network to access the communications network 126.

The controller 118 may receive input from human-machine interface (HMI) controls 130 to provide for user interaction with computing device 102. For instance, the controller 118 may interface with one or more buttons or other HMI controls 130 configured to invoke functions of the controller 118. The controller 118 may also drive or otherwise communicate with one or more displays 132 configured to provide visual output to users, e.g., by way of a video controller. In some cases, the display 132 may be a touch screen further configured to receive user touch input via the video controller 118, while in other cases the display 132 may be a display only, without touch input capabilities.

The headphone testing application 134 is an example of a software application executed by the processor 120 of the controller 118 of the computing device 102. In some examples, the headphone testing application 134 may be preloaded onto the storage 122. In other examples, the headphone testing application 134 may be downloaded over the communications network 126 to the computing device 102 for execution. As one possibility, the headphone testing application 134 may be implemented as a web application using standard web programming tools, such as hypertext markup language 5 (HTML5), JavaScript, and Audio Web Tools, which may be accessed over the communications network 126 from the server 128. In an example, the display 132 may be utilized to present screens of the headphone testing application 134, while the HMI controls 130 may be utilized to receive input to be provided to the headphone testing application 134.

When executed, the headphone testing application 134 may be configured to administer headphone testing, implement finite input response (FIR) filters for simulation of headphones, and collect listener ratings. The headphone testing application 134 may be further configured to provide for storage and analysis of the listeners' ratings, as well as offloading of listener test results over the communications network 126. The headphone testing application 134 may also provide for the customization of the user's headphones 116 as well as facilitating purchase of headphone 116 models that conform with the user's preferences.

Headphone characteristics 136 may include information specifying the audible properties of various sets of headphones 116. These headphone characteristics 136 may include, as some examples, leakage characteristics and frequency response characteristics. In one example, the headphone characteristics 136 may be measured using an average of multiple frequency responses recorded using an occluded ear simulator. In one specific example, a GRAS 43AG Ear and Cheek coupler equipped with an IEC 711 coupler may be utilized to record the frequency response of various models of headphones 116. In many examples, the headphone characteristics 136 may further include additional information about the headphones 116, such as a make and model of the headphone, and/or a unique identifier of the make and model of the headphones 116.

A connected headphone identifier 138 may be an identifier of the current pair of headphones 116 that is connected to the computing device 102. In an example, the headphones 116 may be a standardized pair of headphones with a defined frequency response. In some examples, the headphones 116 may be of a type selected by the user from headphone characteristics 136 available to the computing device 102.

In some cases, the headphones 116 may be a well-behaved headphone 116 equipped with MEMs microphones to measure and control leakage effects. Such standardized headphones may be referred to as replicator headphones, in some instances. The replicator headphones 116 may have both defined frequency response and defined leakage parameters. By using a replicator headphone 116, headphones may be virtualized according to headphone characteristics 136 including both frequency response and defined leakage. This may, accordingly, provide for more accurate and reliable virtualizations as compared to use of headphones 116 lacking measurement of leakage.

The storage 122 may maintain the connected headphone identifier 138 of the headphones 116 that are connected. By using the connected headphone identifier 138, the computing device 102 can identify the headphone characteristics 136 of the headphones 116 available to the computing device 102.

The headphones 116 may be equalized through use of the audio processor 108 to provide a measured magnitude response and/or other characteristics of a headphone model to be simulated. Thus, the headphone model to be simulated may be a specific model of headphones which response was previously characterized, e.g., though use of headphones characteristics 136 defined using frequency response measurements of the headphone 116, as tested. In another example, the headphone model to be tested may be theoretical, and headphones characteristics 136 may be utilized for a hypothetical headphone 116 that is not an actual characterized device.

The headphone testing application 134 may utilize the headphone characteristics 136 of the connected set of headphones 116, in combination with the headphone characteristics 136 of the headphones 116 to be simulated, to generate a difference in frequency response from the connected headphones 116 to the simulated headphones 116 to be tested. This difference in frequency response may be applied to the connected headphones 116 (e.g. via FIR filters), to allow the connected headphones 116 to sound as if they were the headphones 116 being simulated.

A user profile 140 may include various details of the user of the computing device 102. In an example, the user profile 140 may include credentials of the user, such as a username and password, or biometrics such as a face identification, fingerprint, eye scan, or voice print. The user profile 140 may further include demographic information used for the back-end analytics that may be relevant to sound quality preferences, such as age, gender, listening expertise, self-assessed or known hearing loss, date of last hearing test, or music tastes.

While an exemplary modularization of the computing device 102 is described herein, it should also be noted that elements of the computing device 102 may be incorporated into fewer units or may be combined in several units or even in one unit.

Figure 2:
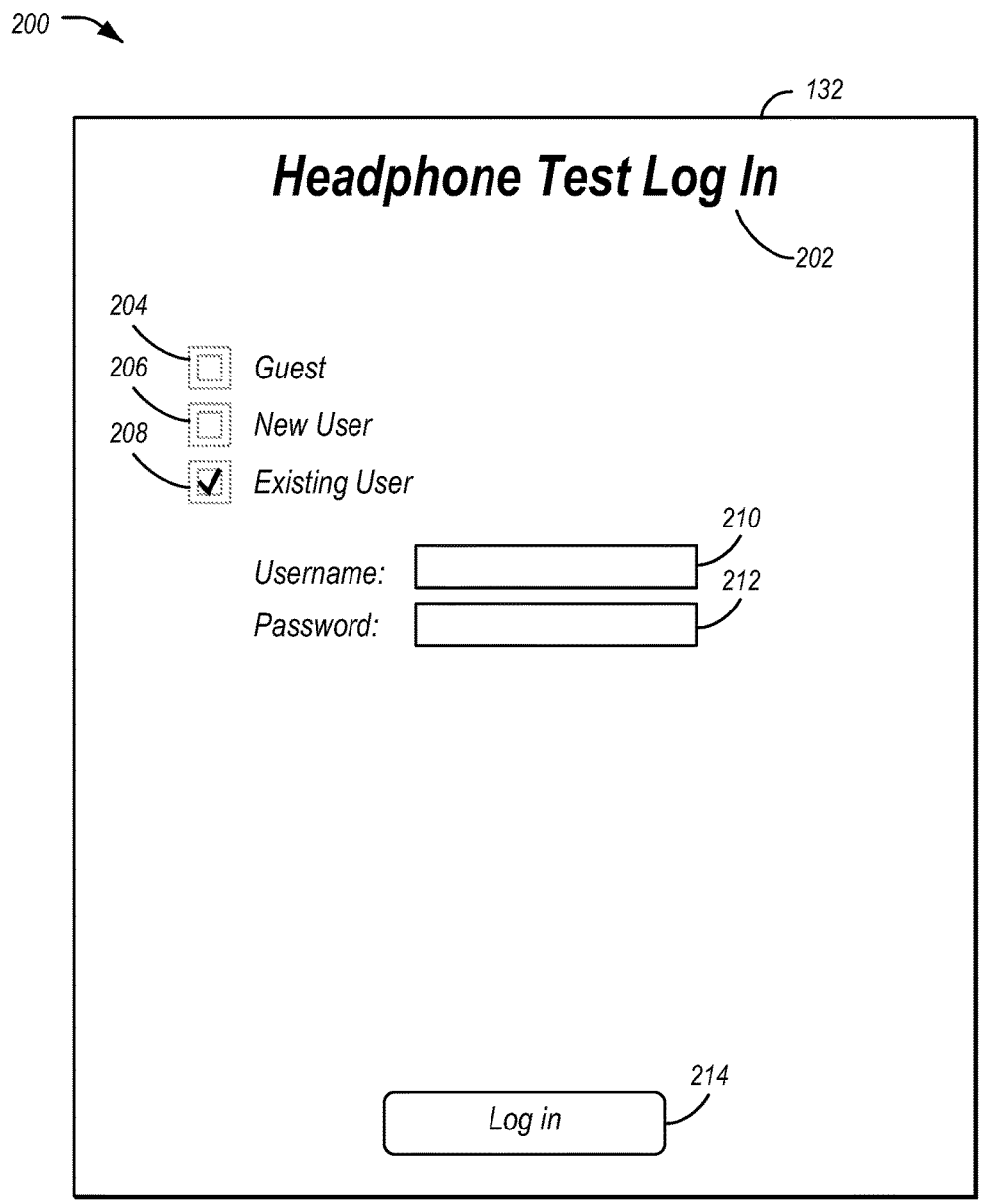
FIG. 2 illustrates an example user interface for logging into the headphone testing application.

FIG. 2 illustrates an example user interface 200 for logging into the headphone testing application 134. In an example, the user interface 200 may be displayed to the display screen 132 of the computing device 102 responsive to activation of the headphone testing application 134.

As shown, the user interface 200 may include a label 202 that indicates that the user interface 200 is for logging into the headphone testing application 134. The user interface 200 may also include a set of controls for selecting how to log into the headphone testing application 134. These may include, for instance, a guest control 204 for selecting a guest user account, a new user control 206 for creating a new user account, and an existing user control 208.

In the illustrated example, the existing user control 208 is selected. Accordingly, the user interface 200 provides a username control 210 and a password control 212 into which the user may enter the credentials of the existing user. The user may, accordingly, enter the username and password in the controls, and may select the next control 214 to advance to a next screen of the headphone testing application 134.

In another example, were the guest control 204 to be selected and guest logins be allowed, the username control 210 and password control 212 may be removed or disabled, and the user may them simply select the next control 214. However, using the guest option, the headphone testing application 134 may be unable to use demographics, stored payment information, or other information specific to the user.

In yet another example, were the new user control 206 to be selected, the user interface 200 may prompt the user for user profile 140 information to use to create a system account. This information may include, for instance, a username, a password, and demographic information used for the back-end analytics that may be relevant to sound quality preferences, such as age, gender, listening expertise self-assessed or known hearing loss/date of last hearing test, or music tastes.

Figure 3:
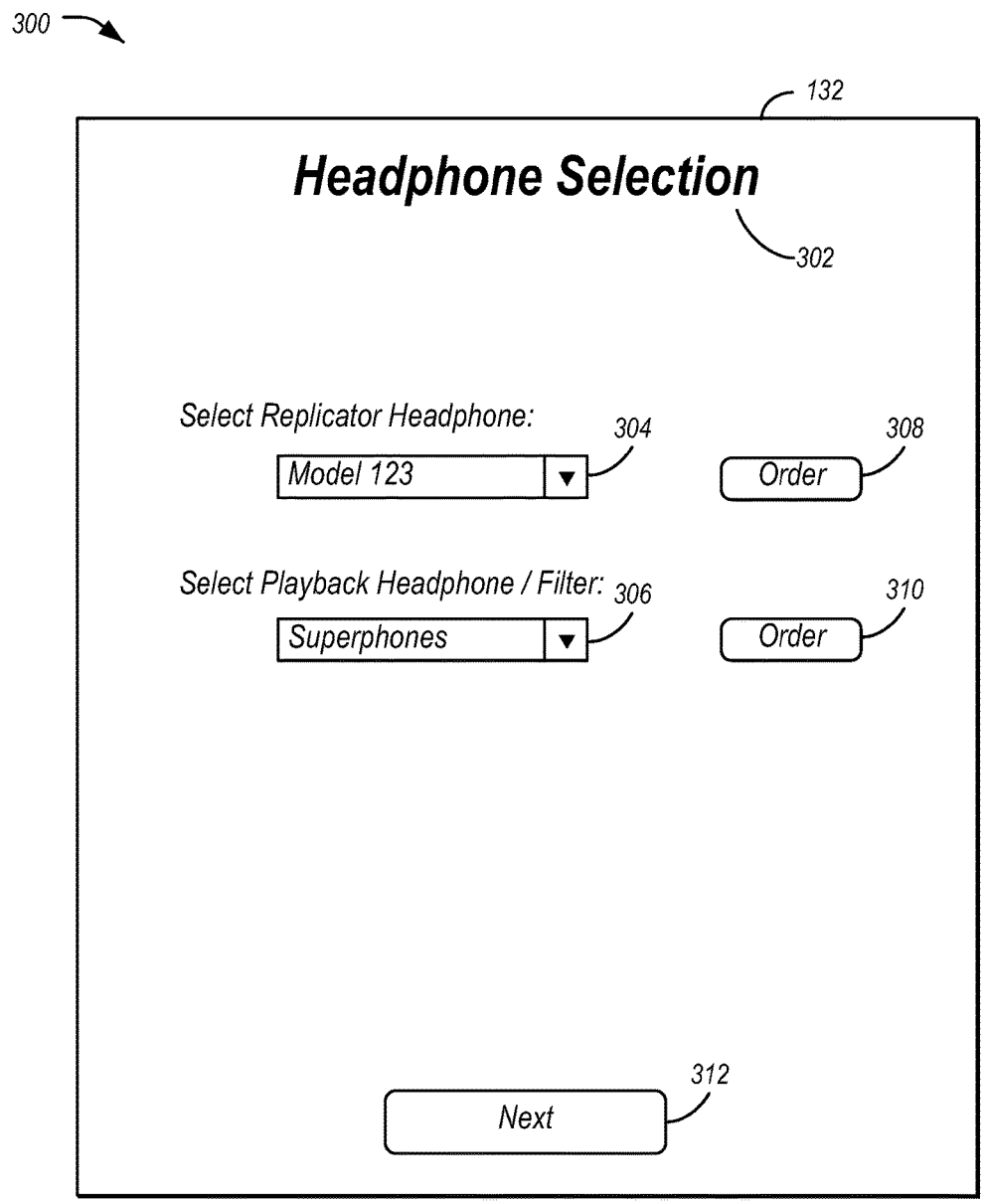
FIG. 3 illustrates an example user interface for receiving selection of the currently connected headphones.

FIG. 3 illustrates an example user interface 300 for receiving selection of the currently connected headphones 116. In an example, the user interface 300 may be displayed to the display screen 132 by the headphone testing application 134 responsive to user selection of the next control 214 of the user interface 200.

The user interface 300 may include a label 302 that indicates that the user interface 300 is for receiving selection of the currently connected model of headphones 116. The user interface 300 may further include a replicator headphone control 304 that provides a list of headphone models from which the user may select the model of headphones 116 that are connected to the computing device 102. Responsive to the selection, the headphone testing application 134 may store to the storage 122 a connected headphone identifier 138 corresponding to the selected headphone 116 model.

The user interface 300 may also include a playback filter control 306 that provides a list of headphone models or custom filters from which the user may select. Using the model or filter selected from the list, the headphone testing application 134 may further apply the filter or model settings to the output of the headphones 116. This may be done, for example, to account for user preferences, or to adjust for hearing deficiencies in the listener, as some possibilities.

Selection of the connected model of headphones 116 may, accordingly, allow the headphone testing application 134 to access response characteristics of the connected headphones 116 for use in re-equalizing the connected headphones 116 to simulate other models of headphone 116. For instance, the headphone testing application 134 may retrieve headphone characteristics 136 that correspond to the connected headphone identifier 138, as well as headphone characteristics 136 that correspond to the selection from the playback filter control 306. Based on both sets of headphone characteristics 136, the headphone testing application 134 may generate a difference in frequency response from the connected headphones 116 to the simulated headphones 116 to be tested. This difference in frequency response may be applied to the connected headphones 116 (e.g. via FIR filters), to allow the connected headphones 116 to sound as if they were the headphones 116 being simulated.

The user interface 300 may further include an order control 308 that, when selected causes the headphone testing application 134 to initiate an order to purchase a set of the headphones 116 indicated as the current selection in the replicator headphone control 304. The user interface 300 may also include an order control 310 that, when selected causes the headphone testing application 134 to initiate an order to purchase a set of the headphones 116 indicated as the current selection in the playback filter control 306 (if the filter is a headphone model and not a filter setting with no corresponding headphone 116 model). In examples where the user is logged in as a new user or an existing user with payment information included in the user profile 140 of the logged-in user, that payment information may be used to aid in completing the order for the headphones 116.

Once the user has made selections from the replicator headphone control 304 and the playback filter control 306, the user may select a next control 312 to continue.

Figure 4:
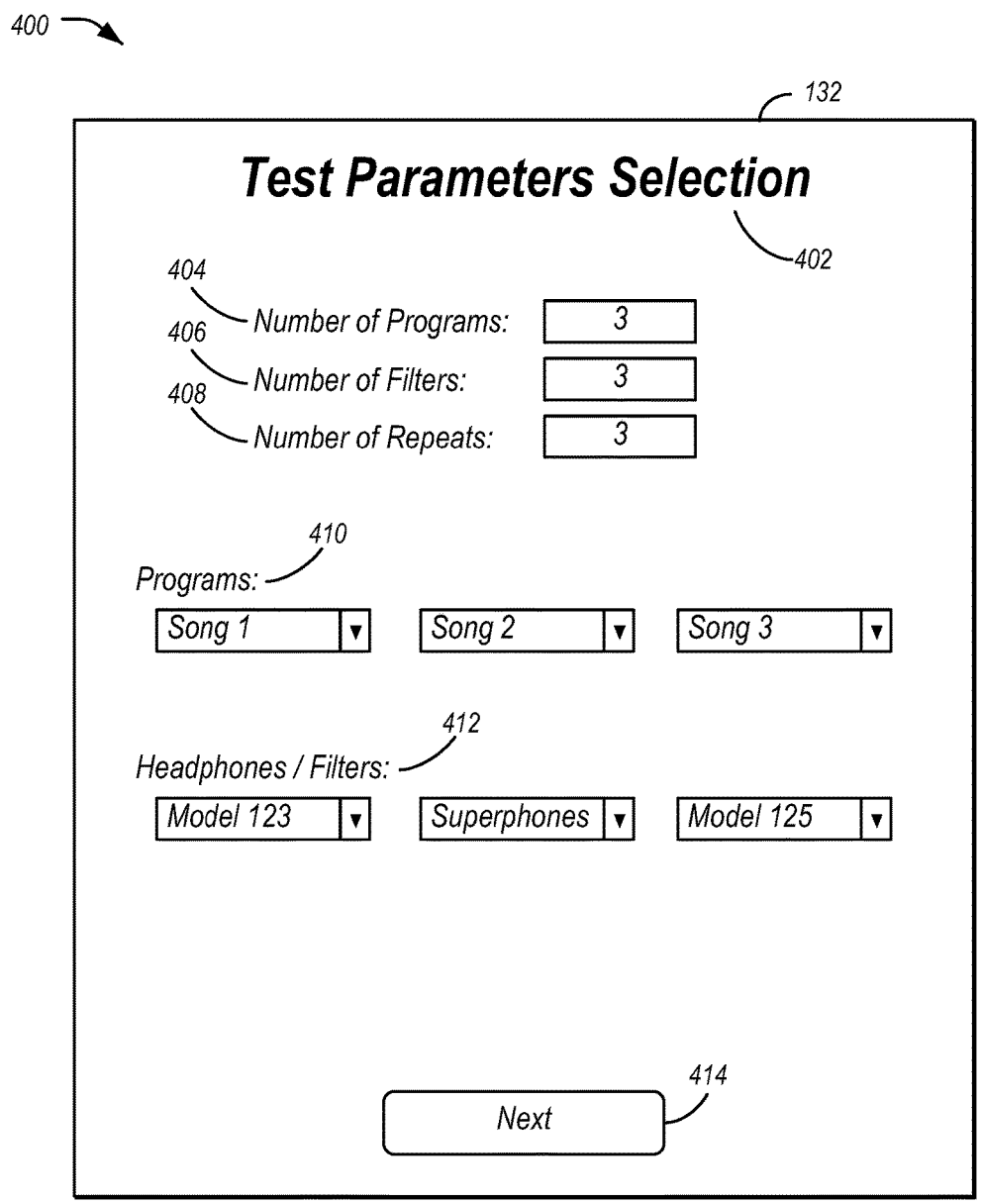
FIG. 4 illustrates an example user interface for receiving selection of parameters a headphone test to be performed.

FIG. 4 illustrates an example user interface 400 for receiving selection of parameters a headphone test to be performed. In an example, the user interface 400 may be displayed to the displays screen 132 by the headphone testing application 134 responsive to user selection of the next control 312 of the user interface 300.

The user interface 400 may include a label 302 that indicates that the user interface 400 is for receiving selection of parameters of a headphone test. The user interface may additionally include controls that specify the number of items to be tested. For instance, the user interface 400 may include a number of programs control 404 configured to receive a number of songs or other audio programs to be played back during the headphone test, a number of filters control 406 configured to receive a number of filters to be applied to the audio playback during the headphone test, and/or a number of repeats control 408 configured to receive a number of times for each program and/or filter to be played back during the headphone test.

The user interface 400 may further provide a set of program selection controls 410 equal to the number entered into the number of programs control 404. For instance, as shown, the number of programs control 404 includes the number three, and three program selection controls 410 are displayed. The user may utilize the program selection controls 410 to select from a listing of available songs or other sound clips to be played during the headphone test.

The user interface 400 may also provide a set of headphone selection controls 412 equal to the number entered into the number of filters control 406. For instance, as shown, the number of filters control 406 includes the number three, and three headphone selection controls 412 are displayed. The user may utilize the headphone selection controls 412 to select from a listing of available headphone models to be simulated during the headphone test.

Once the user has made selections from the program selection controls 410 and the headphone selection controls 412, the user may select the next control 414 to continue.

Figure 5:
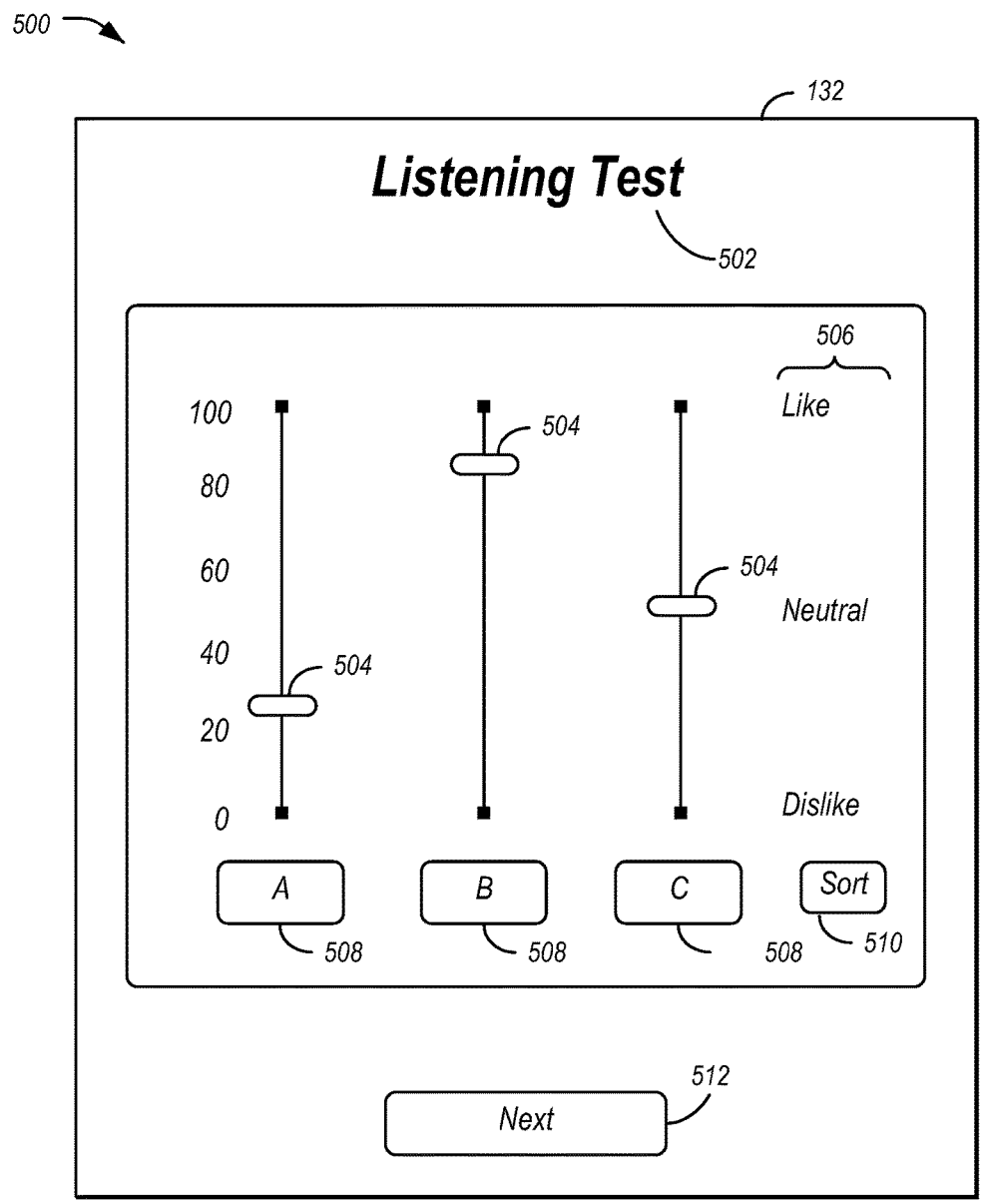
FIG. 5 illustrates an example user interface for performing the headphone preference test.

FIG. 5 illustrates an example user interface 500 for performing the headphone 116 preference test. In an example, the user interface 500 may be displayed to the displays screen 132 by the headphone testing application 134 responsive to user selection of a next control 414 of the user interface 400.

The user interface 500 may include a label 502 that indicates that the user interface 500 is for performing the headphone test. The user interface 500 additionally includes controls that may be used by the user to provide the subjective results of the test to the headphone testing application 134. In the illustrated example, the user interface 500 includes a set of user feedback controls 504 that the user may use to choose a level of like or dislike for a sound clip played back through the headphones 116. The level of like or dislike may also be represented as a scale from 0 to 100, with 0 being the most disliked, and 100 being the most liked. As shown, the user feedback controls 504 are illustrated as slider control; although knobs, spinners, or other forms of controls having multiple positions may be utilized as well.

The user interface 500 also includes a user feedback key 506 that provides context for the user selections made via the user feedback controls 504.

The user may select test controls 508 to have a clip played, and may then select a value for the feedback using the corresponding user feedback control 504. For example, the user may press the A test control 508 to hear a first test and provide the result using a first feedback control 504, press the B test control 508 to hear a second test and provide the result using a second feedback control 504, and press the C test control 508 to hear a third test and provide the result using a third feedback control 504. Responsive to selection of the test controls 508, the headphone testing application 134 may implement FIR settings that correspond to the headphone to be simulated, and may play a program using the implemented settings. Notably, the user interface 500 may be able to perform a blind listening test by randomizing the order of the headphones 116 being tested. Thus, the user would be unable to identify which headphones are being tested according to which test controls 308. The user interface 500 may also include a sort control 510 that, when selected sorts the test results in order from most to least liked (or the reverse.) Once the user has completed performing the test, the user may select a next control 512 to continue.

Figure 6:
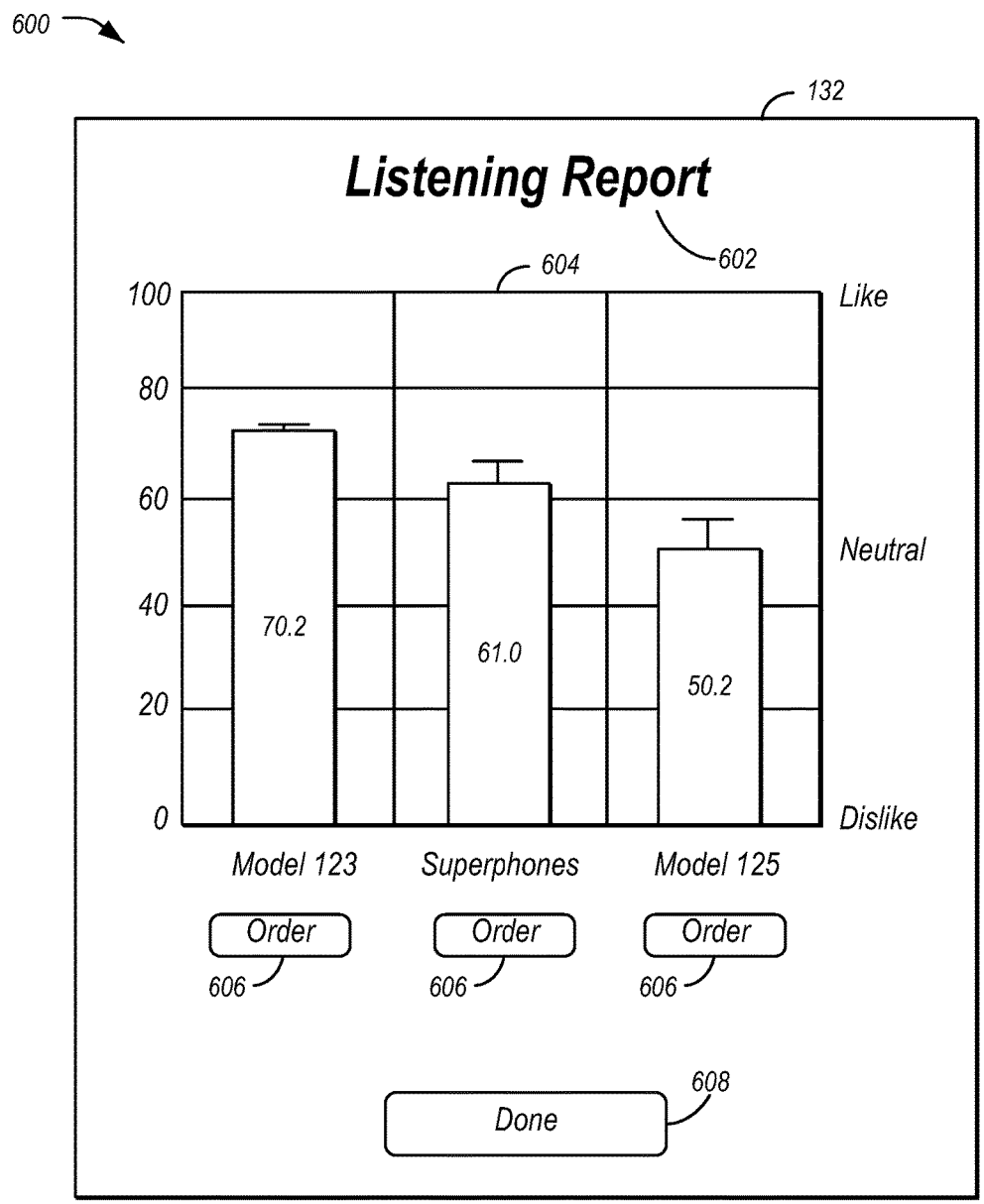
FIG. 6 illustrates an example user interface for displaying a report including results of the preference test.

FIG. 6 illustrates an example user interface 600 for displaying a report including results of the preference test. In an example, the user interface 600 may be displayed to the displays screen 132 by the headphone testing application 134 responsive to user selection of the next control 512 of the user interface 500.

The user interface 600 may include a label 602 that indicates that the user interface 600 is for displaying results of the headphone test. The user interface 600 may further include test results 604 illustrating the relative scores determined for the simulated headphones that were tested. Similar to as done in the user interface 500, the level of like or dislike may be represented as a scale from 0 to 100, with 0 being the most disliked, and 100 being the most liked. In an example, the headphone testing application 134 provides test results 604 including mean ratings and 95% confidence intervals for each of the headphones that was rated. As shown, the first headphone (e.g., Model 123) is shown with a mean rating of 70.2, the second headphone (e.g., Superphones) is shown with a mean rating of 61, and the third headphone (e.g., Model 125) is shown with a mean rating of 50.2. The mean ratings are also shown with confidence interval indications in the illustrated example.

The test results 604 may further include indications of how much better or worse the user's own headphone 116 sounds compared to alternative options. As some other possibilities, the test results 604 may optionally include a statistical table showing an analysis of variance of the data, including mean squares, F-statistics, and p-values for the headphone and program factors. The headphone F-statistic would be a measure of their performance based on the discrimination and reliability of their ratings.

In some examples, the users may also be shown any program effects and interactions with the headphones 116. The user's personal data may also be shown against the entire population of listeners so the user can put their performance and tastes in context with the other users. The test results 604 may further provide a listener "IQ" based on the headphone F-statistic. For instance, if the user agreed to share their listener performance/headphone preference data, the headphone testing application 134 may provide a social media opportunity for users to find other users with similar performance and/or preferences according to the listening test.

The user interface 600 may also include order controls 606 that, when selected, causes the headphone testing application 134 to initiate an order to purchase a set of the headphones 116 indicated as the current selection in the replicator headphone control 304. The order controls 606 may operate similar to as discussed above with respect to the order controls 308 and 310, but may instead allow the user to select to order one or more of the models of headphone 116 illustrated in the test results 604. Once the user has completed reviewing the test, and optionally ordering any desired headphones 116, the user may select a done control 608 to end the test.

Figure 7:
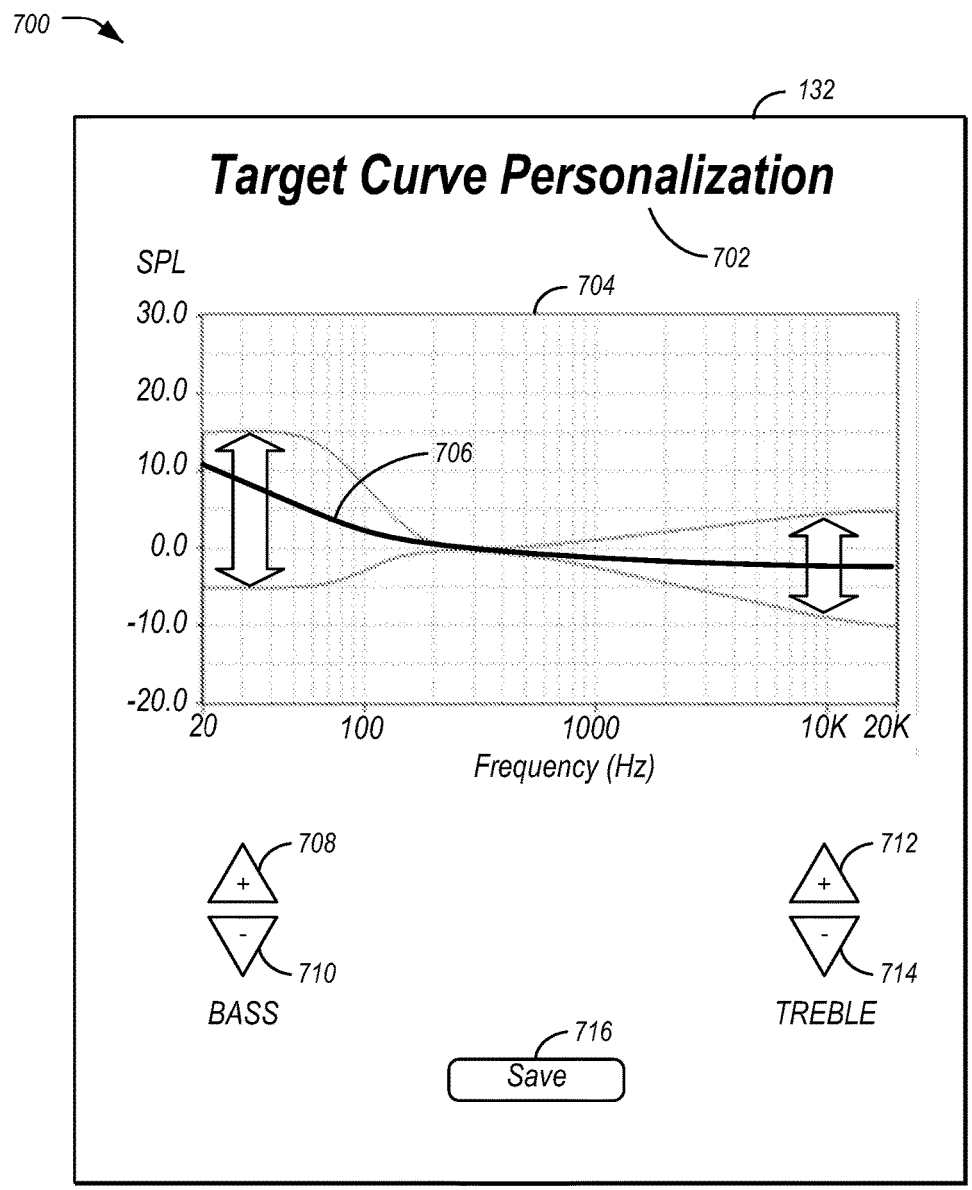
FIG. 7 illustrates an example user interface for performing sound customization of the connected headphones.

FIG. 7 illustrates an example user interface 700 for performing sound customization of the connected headphones 116. In an example, the user interface 700 may be displayed to the displays screen 132 by the headphone testing application 134 responsive to user selection of a sound customization feature of the headphone testing application 134.

The user interface 700 may include a label 702 that indicates that the user interface 700 is for performing target curve personalization. The user interface 700 may further include a frequency graph 704 including a graphical illustration of a target response curve 706 of the connected headphones 116. In an example, the target response curve 706 may illustrate a frequency response that is based on the headphone characteristics 136 of the connected headphone 116.

The user interface 700 may further include additional controls to allow the user to customize aspects of the target response curve 706. In an example, the user interface 700 may include bass increase 708 and bass decease 710 controls that, when selected adjust up or down the low-frequency response of the target response curve 706. In another example, the user interface 700 may include treble increase 712 and treble decease 714 controls that, when selected, adjust up or down the high-frequency response of the target response curve 706. Once the user has completed the adjustments to the target response curve 706, the user may select a save control 716 to save the settings. In an example, these settings may be maintained as a custom filter that can be applied to headphones 116 to adjust the headphone 116 response.

The user interface 700 may also be utilized to provide for trials for selection of preferred equalization settings. In one example, the computing device 102 performs three or more trials per music track where, for each trial, starting levels for bass and treble are randomly set and the user is requested to set those values to a preferred location. The results of multiple of these trials may be averaged or otherwise compared to aid in determining a most preferred setting.

Figure 8:
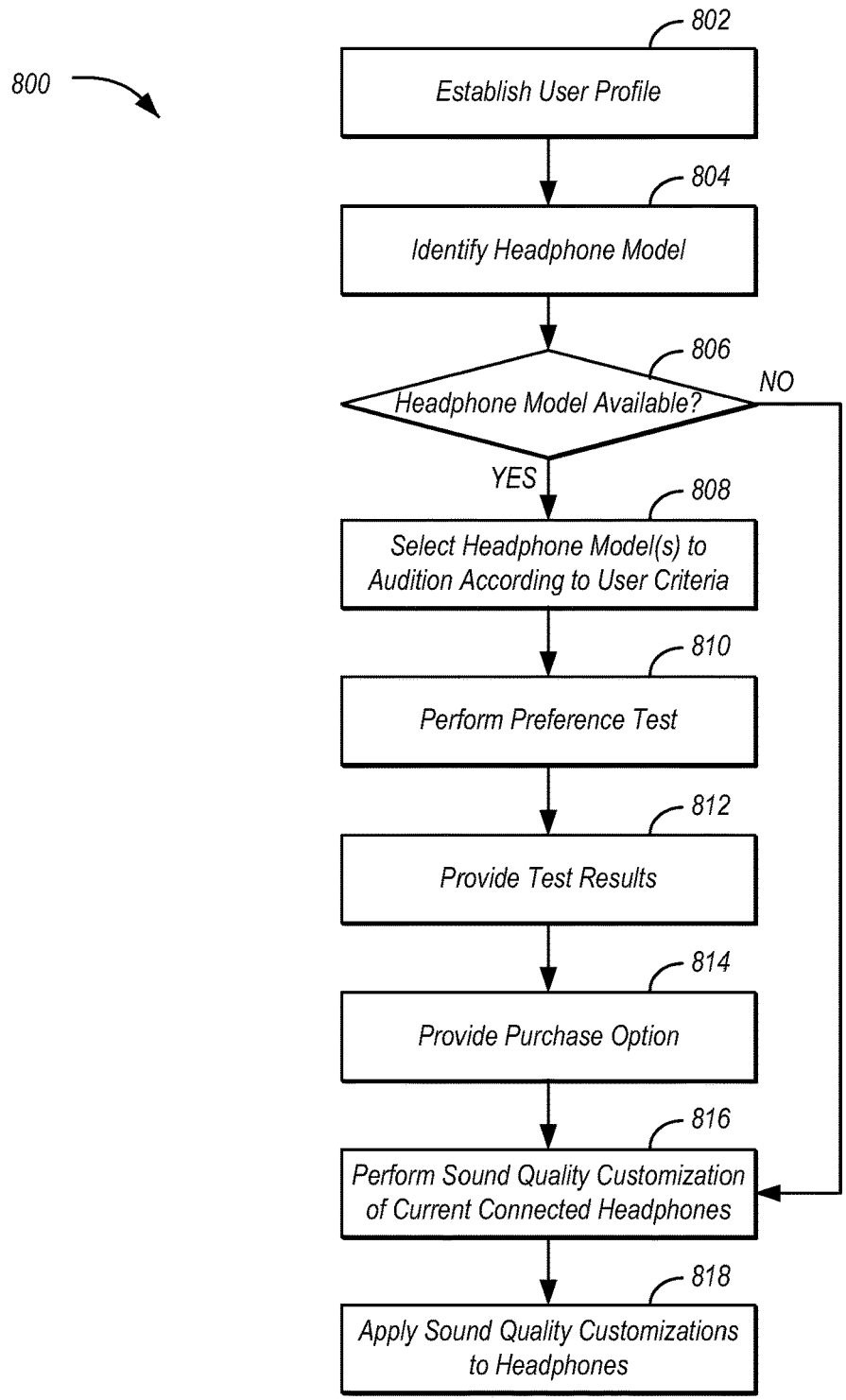
FIG. 8 illustrates an example process for the customization of headphone sound quality.

FIG. 8 illustrates an example process 800 for customization of headphone sound quality. In an example, the process 800 may be performed by the computing device 102 of FIG. 1 executing the headphone testing application 134.

At 802, the computing device 102 establishes a user profile 140. In an example, the headphone testing application 134 may request the user set up a new account (username/password) or log in to their existing account. For instance, the first time that a user executes the headphone testing application 134, the headphone testing application 134 may prompt the user to enter various user details to establish an account. These details may include, as some examples, demographic information used for the back-end analytics that may be relevant to sound quality preferences, such as age, gender, listening expertise, self-assessed or known hearing loss or date of last hearing test, and musical tastes. These details may also include a username and password or other credentials that the user may utilize to log into the user profile 140 account. In an example, the user profile 140 may be established using an interface such as the user interface 200 discussed in detail above.

At 804, the computing device 102 identifies a headphone model of the user. In an example, the headphone testing application 134 provides a selection from which the user may choose a make and model of headphone to be used for performing the test. The user interface 300 illustrates an example for receiving such a selection. In another example, the headphone testing application 134 may access a hardware configuration of the computing device 102, and may determine a model of headphone connected to the computing device 102 via the hardware configuration. In some examples, the headphone may be an in-ear headphone, while in other examples the headphone may be an over-the-ear headphone.

In an example, the computing device 102 may access the headphone characteristics 136 maintained to the storage 122 to confirm that headphone characteristics 136 corresponding to the headphones 116 are available to the headphone testing application 134. In some cases, if the headphone characteristics 136 are not available at the computing device 102, the computing device 102 may query the server 128 over the communications network 126 for the headphone characteristics 136 corresponding to the connected headphones 116.

In another possibility, the computing device 102 may offer the user an option to be provided with replicator headphones 116 for purpose of the testing. As one possibility, the user may be offered to be shipped replicator headphones 116 for use in testing, which may, in some cases, be required to be returned or the user may be charged for the replicator headphones 116. For instance, the user interface 300 provides the order control 308 by which replicator headphones 116 may be ordered.

At operation 806, the computing device 102 determines whether headphone characteristics 136 for the headphones 116 are available. If headphone characteristics 136 are available, then headphone virtualization testing may be performed, and control passes to operation 808. If headphone characteristics 136 are not available, then headphone virtualization testing cannot be performed, and control passes to operation 816.

At 808, the computing device 102 receives a selection of one or more headphone models to be auditioned. In an example, a user interface of the headphone testing application 134 may present a listing of headphones that are being considered for purchase. The headphones 116 may be selected according to parameters such as type (e.g., in-ear, over-the-ear, wireless, etc.), price, weight, and/or other criteria. In an example, the headphones 116 and programs to be played back may be selected using an interface such as the user interface 400 discussed in detail above.

At 810, the computing device 102 performs preference testing for the headphone models to be auditioned. In an example, the computing device 102 performs a double-blind listening test of the selected headphone models to be auditioned. In some examples, the test is further designed to include the connected headphones 116 as one of the headphones 116 in the listening test. In some examples, the test is further designed to include a replicator headphone (or target), as well as a low anchor, poor quality headphone. For instance, the user interface 500 provides an example for performing the preference test and receiving user input regarding the headphones 116. Moreover, by including reference and low-quality headphones, the listening test may provide the user a range of choices that cover the entire sound quality scale and to promote a consistent use of the scale.

At 812, the computing device 102 provides test results according to the preference test. An example display of test results is describe above with respect to the user interface 600.

At 814, the computing device 102 provides purchase options based on the test results. In an example, the computing device 102 may provide the user with an option to purchase the headphone 116 that was preferred in the test. For instance, the computing device 102 may include a link to an Internet website from which the preferred headphones may be purchased. In an example, the user interface 600 provides order controls 606 for the purchase of models of headphones 116 simulated during the test. Or, in another example, if the computing device 102 is at a retail store location, the computing device 102 may indicate whether the headphones 116 are available in the store for purchase, or may allow the user to purchase the headphones to take home.

At 816, the computing device 102 performs sound quality customization of the current connected headphones 116. In an example, the computing device 102 may provide a user an option to customize the sound of the headphone 116 through a series of trials, in which the user adjusts bass and treble levels according to taste while listening to music excerpts.

In one example, the computing device 102 performs three or more trials per music track where, for each trial, the user is provided with bass and treble controls, where the starting levels of bass and treble are randomly set. Through use of the controls, the user adjusts the levels until the user is satisfied with the sound. As one possibility, bass level adjustments may be made via $2^{nd}$-order low-frequency shelf filter set at 125 Hz covering a range of +12 to −6 dB, while treble level adjustments may be made via $2^{nd}$ order high frequency shelf filter set at 1.5 kHz. In an example, the user interface 700 may be utilized for the performing of such trials.

After the tests are concluded, the user may be provided a graph of the results, showing mean preferred bass and treble levels including 95% confidence intervals. If the listener sets the filters to 0 dB, this means the user likes the sound of the connected headphone 116 as-is, and no further changes or customization are required. On the other hand, if the user prefers a significant level change to the bass and treble, this is evidence that the sound of the connected headphone 116 is to be optimized to the preference of the user.

Additionally, the data from the test may be provided by the computing device 102 to the server 128 to provide the server 128 with analytics on headphones based on how much bass and treble adjustment is performed. The server 128 may further gain insight into how demographics (age, gender, etc.) and hearing loss may affect the preferred bass and treble gain in headphones. After operation 818, the process 800 ends.

Computing devices described herein generally include computer-executable instructions, where the instructions may be executable by one or more computing devices such as those listed above. Computer-executable instructions may be compiled or interpreted from computer programs created using a variety of programming languages and/or technologies, including, without limitation, and either alone or in combination, Java™, C, C++, Visual Basic, Java Script, Perl, etc. In general, a processor (e.g., a microprocessor) receives instructions, e.g., from a memory, a computer-readable medium, etc., and executes these instructions, thereby performing one or more processes, including one or more of the processes described herein. Such instructions and other data may be stored and transmitted using a variety of computer-readable media.

With regard to the processes, systems, methods, heuristics, etc., described herein, it should be understood that, although the steps of such processes, etc., have been described as occurring according to a certain ordered sequence, such processes could be practiced with the described steps performed in an order other than the order described herein. It further should be understood that certain steps could be performed simultaneously, that other steps could be added, or that certain steps described herein could be omitted. In other words, the descriptions of processes herein are provided for the purpose of illustrating certain embodiments, and should in no way be construed so as to limit the claims.

While exemplary embodiments are described above, it is not intended that these embodiments describe all possible forms of the invention. Rather, the words used in the specification are words of description rather than limitation, and it is understood that various changes may be made without departing from the spirit and scope of the invention. Additionally, the features of various implementing embodiments may be combined to form further embodiments of the invention.

What is claimed is:

1. A headphone testing system comprising:
a memory storing a headphone test application, headphone characteristics of a headphone connected to the headphone testing system, and headphone characteristics of a plurality of headphone models to test; and
a processor programmed to execute the headphone test application to:
generate a first difference in frequency response from the connected headphone to the first of the plurality of headphones models to be tested;
simulate a first of the plurality of headphone models using the headphone characteristics of the connected headphone and the headphone characteristics of the first of the plurality of headphone models by playing a first audio program through the connected headphones equalized according to the first difference in frequency response,
simulate a second of the plurality of headphone models using the headphone characteristics of the connected headphone and the headphone characteristics of the second of the plurality of headphone models,
generate a second difference in frequency response from the connected headphones to the second of the plurality of headphones models to be tested;
receive user input regarding user preference for the first of the plurality of headphone models and the second of the plurality of headphone models by playing a second audio program through the connected headphones equalized according to the second difference in frequency response, and
present results indicating which of the headphone models is scored highest according to the user input.

2. The system of claim 1, wherein the processor is further programmed to provide an option to purchase a headphone model that was scored highest according to the results.

3. The system of claim 1, wherein the processor is further programmed to provide an option to purchase a replicator headphone to use as the connected headphone.

4. The system of claim 1, wherein the processor is further programmed to access a remote server to receive the headphone characteristics.

5. The system of claim 1, wherein the headphone characteristics include frequency response measurements of the connected headphone and frequency response measurements of the plurality of headphone models to test.

6. The system of claim 1, wherein the results include a graphical illustration of relative scores determined for at least the first of the plurality of headphone models and the second of the plurality of headphone models that were tested.

7. The system of claim 1, wherein the results further include options to purchase one or more of the first of the plurality of headphone models and the second of the plurality of headphone models that were tested.

8. A method for testing headphones comprising: receiving a selection of a plurality of headphone models to be tested;
generating a difference in frequency response from the replicator headphone to the respective headphone model to be tested;
simulating, using a replicator headphone, each of the plurality of headphone models in a randomized order to perform a blind listening test by playing an audio program through the replicator headphone equalized according to the difference in frequency response;
receiving one or more user inputs regarding user preference for the headphone models; and
presenting test results indicating a preference score for each of the plurality of headphone models to be tested, each preference score accompanied by an option to purchase respective headphone model of the plurality of headphone models.

9. The method of claim 8, further comprising:
identifying demographic information from a user profile of a logged-in user;
sending the demographic information and the test results to a server; and
providing analytics regarding the test results in view of other users with corresponding demographic information.

10. The method of claim 8, further comprising providing an option to purchase a headphone model that was most preferred according to the results.

11. The method of claim 8, further comprising providing an option to purchase a replicator headphone to use to perform preference testing of the plurality of headphone models to be tested.

12. The method of claim 8, further comprising accessing a remote server to receive headphone characteristics of the replicator headphone and of the plurality of headphone models to be tested.

13. The method of claim 12, wherein the headphone characteristics include frequency response measurements of the replicator headphone and of the plurality of headphone models to test.

14. The method of claim 8, wherein the results include a graphical illustration of relative scores determined for the plurality of headphone models.

15. The method of claim 8, wherein the results further include options for purchasing the plurality of headphone models that were tested.

16. A non-transitory computer-readable medium comprising instructions of a headphone test application that, when executed by a processor of a computing device, cause the computing device to:
- receive a selection of a plurality of headphone models to be tested through a replicator headphone receiving audio from the computing device;
- simulate each of the plurality of headphone models in a randomized order to perform a blind listening test, including, for each of the respective headphone models to be tested, to generate a difference in frequency response from the replicator headphone to the respective headphones model to be tested and to simulate the respective headphones model by playing an audio program through the replicator headphones equalized according to the difference in frequency response;
- receive user input regarding user preference for the headphone models responsive to the playing of the audio program through the headphones; and
- present test results indicating a preference score for each of the plurality of headphone models, each preference score accompanied by an option to purchase the respective headphone model.

* * * * *